(12) United States Patent
Nam et al.

(10) Patent No.: US 9,598,582 B2
(45) Date of Patent: Mar. 21, 2017

(54) ENCAPSULATING COMPOSITION, BARRIER LAYER INCLUDING SAME, AND ENCAPSULATED APPARATUS INCLUDING SAME

(71) Applicant: CHEIL INDUSTRIES, INC., Gumi-si, Gyeongsangbuk-do (KR)

(72) Inventors: Seong Ryong Nam, Uiwang-si (KR); Ji Hye Kwon, Uiwang-si (KR); Yeon Soo Lee, Uiwang-si (KR); Ji Yeon Lee, Uiwang-si (KR); Chang Min Lee, Uiwang-si (KR); Min Haeng Cho, Uiwang-si (KR); Seung Jib Choi, Uiwang-si (KR); Kyoung Jin Ha, Uiwang-si (KR)

(73) Assignee: CHEIL INDUSTRIES, INC., Gumi-Si, Gyeongsangbuk-Do (KR)

( * ) Notice: Subject to any disclaimer, the term of this patent is extended or adjusted under 35 U.S.C. 154(b) by 0 days.

(21) Appl. No.: 14/653,653

(22) PCT Filed: Jul. 31, 2013

(86) PCT No.: PCT/KR2013/006898
§ 371 (c)(1),
(2) Date: Jun. 18, 2015

(87) PCT Pub. No.: WO2014/104522
PCT Pub. Date: Jul. 3, 2014

(65) Prior Publication Data
US 2015/0344697 A1    Dec. 3, 2015

(30) Foreign Application Priority Data
Dec. 26, 2012    (KR) .................. 10-2012-0153916

(51) Int. Cl.
C08L 33/14    (2006.01)
C09D 4/00    (2006.01)
(Continued)

(52) U.S. Cl.
CPC .............. *C09D 4/00* (2013.01); *C08F 220/36* (2013.01); *C08L 33/14* (2013.01); *H01L 23/293* (2013.01);
(Continued)

(58) Field of Classification Search
CPC ...... C08F 220/365; C08F 220/36; C09D 4/00; H01L 51/004; H01L 51/5253;
(Continued)

(56) References Cited

U.S. PATENT DOCUMENTS 7,767,498 B2    8/2010    Moro et al.
2007/0184211 A1    8/2007    Kim et al.
2014/0243428 A1*    8/2014    Varghese .............. A61K 47/32
514/772.6

FOREIGN PATENT DOCUMENTS

CN    201616434 U    10/2010
CN    102202886 A    9/2011
(Continued)

OTHER PUBLICATIONS

Chinese Office Action dated Feb. 14, 2016 in Corresponding Chinese Patent Application No. 201380068505.5.

*Primary Examiner* — Sanza McClendon
(74) *Attorney, Agent, or Firm* — Lee & Morse, P.C.

(57) ABSTRACT

The present invention relates to an encapsulating composition, a barrier layer including the same, and an encapsulated apparatus including the same, and the composition comprises (A) a photocurable monomer and (B) a photocurable
(Continued)

monomer containing a carboxylic acid group, wherein (B) the photocurable monomer containing the carboxylic acid group has an amide bond.

13 Claims, 1 Drawing Sheet

(51) Int. Cl.
  *C08F 220/36* (2006.01)
  *H01L 51/52* (2006.01)
  *H01L 51/00* (2006.01)
  *H01L 31/048* (2014.01)
  *H01L 23/29* (2006.01)
  *H01L 23/31* (2006.01)

(52) U.S. Cl.
  CPC ...... *H01L 23/3121* (2013.01); *H01L 23/3135* (2013.01); *H01L 31/048* (2013.01); *H01L 51/004* (2013.01); *H01L 51/5253* (2013.01); *C08F 2220/365* (2013.01); *H01L 2251/301* (2013.01); *H01L 2251/558* (2013.01); *H01L 2924/0002* (2013.01)

(58) Field of Classification Search
  CPC ......... H01L 2251/301; H01L 2251/558; H01L 23/293; H01L 23/3121; H01L 23/3135; H01L 2924/0002; C08L 33/14
  See application file for complete search history.

(56) References Cited

FOREIGN PATENT DOCUMENTS

| | | | |
|---|---|---|---|
| CN | 102664239 | A | 9/2012 |
| CN | 103881022 | A | 6/2014 |
| JP | 2002-241583 | A | 8/2002 |
| JP | 2005-523473 | A | 8/2005 |
| JP | 2006-124500 | A | 5/2006 |
| KR | 10-2010-0013368 | A | 2/2010 |
| KR | 10-2011-0130928 | A | 12/2011 |
| KR | 20120050069 | A * | 5/2012 |
| KR | 10-2012-0106025 | A | 9/2012 |
| TW | 201016813 | A1 | 5/2010 |

* cited by examiner

//<br>
ENCAPSULATING COMPOSITION, BARRIER LAYER INCLUDING SAME, AND ENCAPSULATED APPARATUS INCLUDING SAME

TECHNICAL FIELD

The present invention relates to an encapsulating composition, a barrier layer including the same, a barrier stack including the same, an encapsulated apparatus including the same, and a method of encapsulating an apparatus using the same. More particularly, the present invention relates to an encapsulating composition which includes a specific monomer and thus has high adhesion to an inorganic barrier layer and provides enhanced reliability, thereby realizing a barrier stack for encapsulating an apparatus susceptible to the environment; a barrier layer including the same; a barrier stack including the same; an encapsulated apparatus including the same; and a method of encapsulating an apparatus using the same.

BACKGROUND ART

Organic optoelectronic devices such as organic light emitting diodes, devices including photovoltaic cells, and displays such as organic thin film transistors must be encapsulated to protect their sensitive components from gases in air (mainly oxygen and/or moisture). Improper protection may cause deterioration in quality of the devices. In addition, this may cause occurrence of non-radial dark spots, which also leads to degradation of devices. In particular, in an organic light emitting diode, water vapor may cause degradation of the diode and deterioration in quality of an interface between an anode (or cathode) and an organic film.

Encapsulation may be typically achieved by bonding a glass cap to a display using specific adhesives, particularly adhesives having low water vapor permeability. Generally, to extend lifespan of devices, a solid moisture getter may be interposed between a substrate and a cap. Encapsulation using a cap is suitable for rigid devices, but is not suited for devices including a flexible support (for example, flexible displays).

Such an encapsulation technique is not feasible when a circuit of a substrate does not have a sufficient space as in a complementary metal-oxide semiconductor (CMOS) microdisplay. Particularly, to achieve light weight, application of this technique must be avoided for a device having a large emission area.

In all cases for which encapsulation using a cap is unsuitable, "monolithic" encapsulation, i.e. encapsulation using a thin film having excellent oxygen barrier and water vapor barrier properties is generally used. Examples of most commonly used materials for monolithic encapsulation may include oxide dielectrics/nitrides, which are represented by $SiO_x$, $SiN_x$, $SiO_xN_y$, and $Al_xO_y$, deposited generally using chemical vapor deposition (CVD), and optionally using plasma-enhanced chemical vapor deposition (PECVD) or atomic layer deposition (ALD). The aforementioned methods are preferable to physical vapor deposition such as sputtering, which is aggressive to organic semiconductors and thus causes formation of a film having difficulty in coating a protective film thereon due to defects such as pinholes produced in the deposited film. Deposited films obtained by plasma-enhanced chemical vapor deposition (PECVD) or atomic layer deposition (ALD) have fewer defects than films obtained by physical vapor deposition and are very uniform. In other words, these two methods may provide excellent step coverage.

"To avoid association" of defects of an inorganic layer with other inorganic layers, there has been, for example, an effort to manufacture a multilayer of organic/inorganic/organic/inorganic layers, which is referred to as Barix. This method may reduce water vapor permeability to about $10^{-6}$ $g/m^2/day$ and thus provide sufficient lifespan to allow commercialization of organic light emitting diode displays.

Another typical example of multilayer encapsulation structures includes "NONON" by Philips Electronics, which is a multilayer including a nitride layer and an oxide layer alternately stacked one above another, such as $SiN_x/SiO_x/SiN_x/SiO_x$.

In this regard, U.S. Pat. No. 7,767,498 reported that waterproofing properties of about $10^{-6}$ $g/m^2/day$ were attained by repeatedly depositing about 5 acrylic organic layers and 5 inorganic layers through vacuum deposition. However, in the structure formed by stacking the organic layers, since the organic layers are composed of an organic material having no barrier properties, a cathode layer suffers from corrosion due to water penetration causing light emission failure, which results in deterioration in reliability. In addition, in this structure including 10 deposited layers, if the organic layer does not have a sufficient thickness, the organic layer suffers from deterioration in smoothness when deposited on the inorganic layer. Further, if aluminum oxide, which has good barrier characteristics, is used alone, pinholes having been produced upon deposition continue to grow even when layer thickness is increased, thereby allowing easy penetration of water and oxygen therethrough. This may cause deterioration in adhesion between organic and inorganic layers and thus degradation of waterproofing properties.

DISCLOSURE

Technical Problem

It is an aspect of the present invention to provide an encapsulating composition capable of forming a barrier layer encapsulating an apparatus susceptible to an environment.

It is another aspect of the present invention to provide an encapsulating composition which has high photocuring rate, low curing shrinkage after curing, and high adhesion to an inorganic barrier layer, and thus may realize an encapsulating barrier layer.

It is a further aspect of the present invention to provide a barrier layer realized using the encapsulating composition as set forth above, a barrier stack including the same, an encapsulated apparatus including the same, and a method of encapsulating an apparatus using the same.

Technical Solution

In accordance with one aspect of the present invention, an encapsulating composition may include: (A) a photocurable monomer; and (B) a carboxylic acid group-containing photocurable monomer, wherein the carboxylic acid group-containing photocurable monomer (B) may have an amide bond.

In accordance with another aspect of the present invention, a barrier layer may include a cured product of the encapsulating composition.

In accordance with a further aspect of the present invention, an encapsulated apparatus may include: a member for the apparatus; a barrier stack formed on the member for the apparatus and including an inorganic barrier layer and an organic barrier layer, wherein the organic barrier layer may have an adhesive strength to the inorganic barrier layer of about 20 kgf/(mm)$^2$ to about 100 kgf/(mm)$^2$.

Advantageous Effects

The present invention provides an encapsulating composition which has high photocuring rate, low curing shrinkage after curing, and high adhesion to an inorganic barrier layer, and thus may realize an encapsulating barrier layer having high reliability.

BEST MODE

Figure 1:
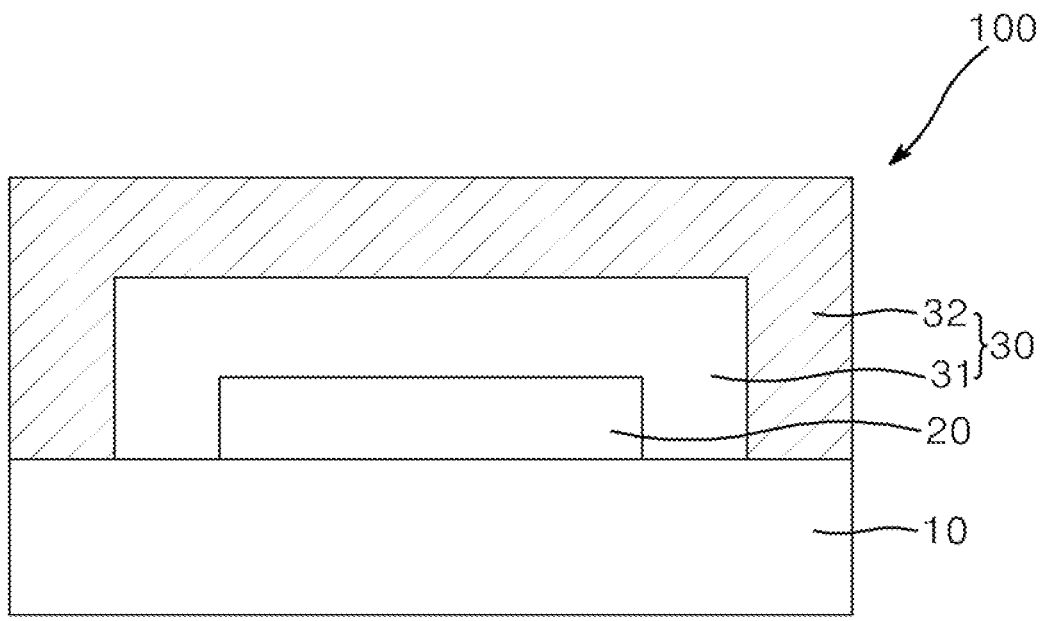
FIG. 1 is a sectional view of an encapsulated apparatus according to one embodiment of the present invention.

As used herein, unless otherwise stated, the term "substituted" in the phrase "substituted or unsubstituted" means that at least one hydrogen atom among functional groups of the present invention is substituted with a halogen atom (F, Cl, Br or I), a hydroxyl group, a nitro group, a cyano group, an imino group (=NH, =NR (R: a $C_1$ to $C_{10}$ alkyl group)), an amino group (—NH$_2$, —NH(R'), —N(R")(R'"), where R', R" and R'" are each independently a $C_1$ to $C_{10}$ alkyl group), a $C_1$ to $C_{20}$ alkyl group, a $C_6$ to $C_{20}$ aryl group, a $C_3$ to $C_{10}$ cycloalkyl group, a $C_3$ to $C_{20}$ heteroaryl group, a $C_2$ to $C_{30}$ heterocycloalkyl group, or a $C_7$ to $C_{21}$ arylalkyl group.

In accordance with one aspect of the present invention, an encapsulating composition may include (A) a photocurable monomer (B) a carboxylic acid group-containing monomer.

(A) Photocurable Monomer

The photocurable monomer is a non-carboxylic acid-based monomer containing no carboxylic acid group and may refer to, for example, a monomer containing a (meth)acrylate group, a vinyl group, and the like as a photocurable functional group.

In some embodiments, the photocurable monomer may include a non-amide-based monomer containing no amide bond.

In some embodiments, the photocurable monomer may include a monofunctional monomer, a polyfunctional monomer, or a combination thereof. The photocurable monomer may include a monomer containing 1 to 30, preferably 1 to 20, more preferably 1 to 5 substituted or unsubstituted vinyl groups, acrylate groups, or methacrylate groups.

In one embodiment, the photocurable monomer may include: $C_6$ to $C_{20}$ aromatic compounds containing a substituted or unsubstituted vinyl group; unsaturated carboxylic acid esters containing a $C_1$ to $C_{20}$ alkyl group, a $C_3$ to $C_{20}$ cycloalkyl group, a $C_6$ to $C_{20}$ aromatic group, or a hydroxyl group and a $C_1$ to $C_{20}$ alkyl group; $C_1$ to $C_{20}$ aminoalkyl group-containing unsaturated carboxylic acid esters; vinyl esters of $C_1$ to $C_{20}$ saturated or unsaturated carboxylic acids; vinyl cyanide compounds; and unsaturated amide compounds.

For example, the photocurable monomer may include: $C_6$ to $C_{20}$ aromatic compounds containing an alkenyl group including a vinyl group, such as styrene, α-methyl styrene, vinyl toluene, vinyl benzyl ether, and vinyl benzyl methyl ether; unsaturated carboxylic acid esters, such as methyl (meth)acrylate, ethyl(meth)acrylate, butyl(meth)acrylate, 2-hydroxyethyl(meth)acrylate, 2-hydroxybutyl(meth)acrylate, hexyl(meth)acrylate, octyl(meth)acrylate, nonyl(meth)acrylate, decanyl(meth)acrylate, undecanyl(meth)acrylate, dodecyl(meth)acrylate, cyclohexyl(meth)acrylate, benzyl (meth)acrylate, phenyl(meth)acrylate, and the like; unsaturated carboxylic acid aminoalkyl esters, such as 2-aminoethyl(meth)acrylate, 2-dimethylaminoethyl(meth)acrylate, and the like; saturated or unsaturated carboxylic acid vinyl esters, such as vinyl acetate, vinyl benzoate, and the like; unsaturated $C_1$ to $C_{20}$ carboxylic acid glycidyl esters, such as glycidyl(meth)acrylate; vinyl cyanide compounds, such as (meth)acrylonitrile; unsaturated amide compounds, such as (meth)acrylamide; and monofunctional or polyfunctional (meth)acrylates of monohydric or polyhydric alcohols including ethylene glycol di(meth)acrylate, triethylene glycol di(meth)acrylate, trimethylolpropane tri(meth)acrylate, 1,4-butanediol di(meth)acrylate, 1,6-hexanediol di(meth)acrylate, octyldiol di(meth)acrylate, nonyldiol di(meth)acrylate, decanediol di(meth)acrylate, undecanediol di(meth)acrylate, dodecyldiol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, bisphenol A di(meth)acrylate, novolac epoxy(meth)acrylate, diethylene glycol di(meth)acrylate, tetraethylene glycol di(meth)acrylate, tri(propylene glycol) di(meth)acrylate, poly(propylene glycol) di(meth)acrylate, and the like, without being limited thereto. The term "polyhydric alcohol" refers to alcohols containing two or more, for example, 2 to 20, preferably 2 to 10, more preferably 2 to 6 hydroxyl groups.

Preferably, the photocurable monomer includes at least one of a (meth)acrylate having a $C_1$ to $C_{20}$ alkyl group, a di(meth)acrylate of a $C_2$ to $C_{20}$ diol, a tri(meth)acrylate of a $C_3$ to $C_{20}$ triol, a tetra(meth)acrylate of a $C_4$ to $C_{20}$ tetraol, and di(meth)acrylates containing at least one unit of —(—Y—O—)n- and —Y— (where Y is a linear or branched $C_1$ to $C_5$ alkylene group, and n is an integer from 1 to 5), preferably having (meth)acrylate connected thereto.

The photocurable monomer may include a mixture of a monofunctional monomer and a polyfunctional monomer. In some embodiments, in the mixture, the monofunctional monomer and the polyfunctional monomer may be present in a weight ratio of about 1:0.1 to about 1:10, preferably about 1:1 to about 1:7, more preferably about 1:2 to about 1:5.

The photocurable monomer may be present, in terms of solid content, in an amount of about 20% by weight (wt %) to about 95 wt %, preferably about 50 wt % to about 95 wt %, more preferably about 60 wt % to about 95 wt %, most preferably about 70 wt % to about 95 wt % in the composition. Within this range, the composition may enhance adhesion between an organic layer and inorganic layer in manufacture of a thin film encapsulation layer, thereby reducing or preventing outgassing and deterioration in water vapor permeability.

(B) Carboxylic Acid Group-Containing Photocurable Monomer

The carboxylic acid group-containing photocurable monomer may improve adhesive strength of the composition to an inorganic barrier layer after curing of the composition to prevent penetration of moisture and oxygen from outside, thereby enhancing reliability of a member for an apparatus.

The carboxylic acid group-containing photocurable monomer may include a photocurable monomer which includes a carboxylic acid group and contains a photocurable functional group (for example, a (meth)acrylate group, a vinyl group, etc.).

In some embodiments, the carboxylic acid group-containing photocurable monomer may be an amide monomer containing an amide bond (—(C=O)—NH—).

In one embodiment, the carboxylic acid group-containing photocurable monomer may include a monomer containing a carboxylic acid group having a cyclized single or double bond.

The term "cyclized" means that the single or double bond is contained in a $C_6$ to $C_{20}$ cycloalkyl group or a $C_6$ to $C_{20}$ aryl group.

In one embodiment, the carboxylic acid group-containing photocurable monomer may be represented by Formula 1:

[Formula 1]

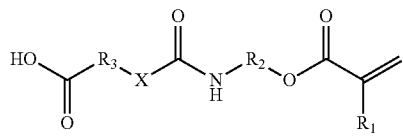

wherein $R_1$ is hydrogen or a substituted or unsubstituted $C_1$ to $C_{20}$ alkyl group, $R_2$ is a substituted or unsubstituted $C_1$ to $C_{30}$ alkylene group, a substituted or unsubstituted $C_6$ to $C_{30}$ arylene group, or a $C_5$ to $C_{20}$ cycloalkylene group, $R_3$ is a substituted or unsubstituted linear or branched $C_1$ to $C_{30}$ alkylene group, a substituted or unsubstituted $C_6$ to $C_{30}$ arylene group, a substituted or unsubstituted $C_6$ to $C_{30}$ arylene group having a hetero atom, or a $C_5$ to $C_{20}$ cycloalkylene group, X is —O—, —S—, or —NR— (R: hydrogen or a $C_1$ to $C_{10}$ alkyl group).

Preferably, $R_2$ is a $C_1$ to $C_5$ alkylene group.

Preferably, $R_3$ is a linear or branched $C_1$ to $C_{15}$ alkylene group, a $C_6$ to $C_{20}$ cycloalkylene group, or a substituted or unsubstituted $C_6$ to $C_{20}$ arylene group. Here, the substituent may be a nitro group.

The carboxylic acid group-containing photocurable monomer may include at least one of Formulas 2 to 6.

[Formula 2]

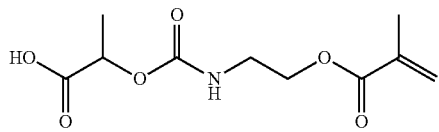

[Formula 3]

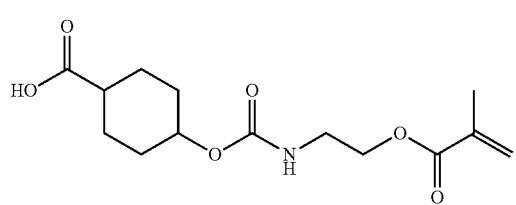

[Formula 4]

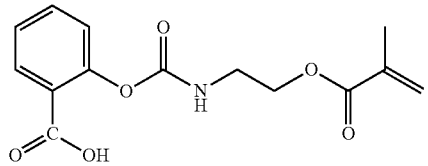

[Formula 5]

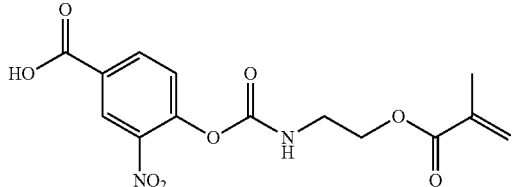

[Formula 6]

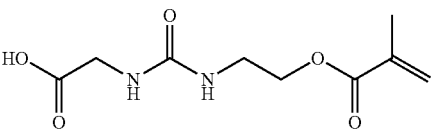

The carboxylic acid group-containing photocurable monomer may be prepared by any typical methods, or may be commercially available products The carboxylic acid group-containing photocurable monomer is included in the photocurable composition together with the photocurable monomer and may increase photocuring rate, and, in a typical encapsulation structure of deposited inorganic and organic barrier layers, may realize an organic barrier layer having high adhesion to the inorganic barrier layer.

The carboxylic acid group-containing photocurable monomer may be present, in terms of solid content, in an amount of about 1 wt % to about 60 wt %, preferably about 1 wt % to about 30 wt %, more preferably about 5 wt % to about 30 wt % in the composition. Within this range, the monomer may provide enhanced adhesion to an inorganic barrier layer.

The composition may further include (C) an initiator.

(C) Initiator

The initiator may include any typical photopolymerization initiators capable of performing photocuring reaction without limitation. For example, the photopolymerization initiator may include triazine, acetophenone, benzophenone, thioxanthone, benzoin, phosphorus, oxime initiators, and mixtures thereof.

Examples of the triazine initiators may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2,4-trichloromethyl(piperonyl)-6-triazine, 2,4-(trichloromethyl(4'-methoxystyryl)-6-triazine, and mixtures thereof.

Examples of the acetophenone initiators may include 2,2'-diethoxyacetophenone, 2,2'-dibuthoxyacetophenone, 2-hydroxy-2-methyl propiophenone, p-t-butyl trichloroacetophenone, p-t-butyl dichloroacetophenone, 4-chloroacetophenone, 2,2'-dichloro-4-phenoxyacetophenone, 2-methyl- 1-(4-(methylthio)phenyl)-2-morpholinopropan-1-one, 2-benzyl-2-dimethylamino-1-(4-morpholinophenyl)-butan-1-one, and mixtures thereof.

Examples of the benzophenone initiators may include benzophenone, benzoyl benzoate, methyl benzoylbenzoate, 4-phenyl benzophenone, hydroxybenzophenone, acrylated benzophenone, 4,4'-bis(dimethylamino)benzophenone, 4,4'-dichlorobenzophenone, 3,3'-dimethyl-2-methoxybenzophenone, and mixtures thereof.

Examples of the thioxanthone initiators may include thioxanthone, 2-methyl thioxanthone, isopropyl thioxanthone, 2,4-diethylthioxanthone, 2,4-diisopropylthioxanthone, 2-chlorothioxanthone, and mixtures thereof.

Examples of the benzoin initiators may include benzoin, benzoin methyl ether, benzoin ethyl ether, benzoin isopropyl ether, benzoin isobutyl ether, benzyl dimethyl ketal, and mixtures thereof.

Examples of the phosphorus initiators may include bis-benzoylphenyl phosphine oxide, benzoyl(diphenyl)phosphine oxide, and mixtures thereof.

Examples of the oxime initiators may include 2-(o-benzoyloxime)-1-[4-(phenylthio)phenyl]-1,2-octanedione, 1-(o-acetyloxime)-1-[9-ethyl-6-(2-methylbenzoyl)-9H-carbazole-3-yl]ethanone, and mixtures thereof.

The initiator may be present, in terms of solid content, in an amount of about 0.1 wt % to about 20 wt %, preferably about 0.5 wt % to about 20 wt %, more preferably about 0.5 wt % to about 10 wt %, most preferably about 0.5 wt % to about 7 wt %, in the composition. Within this range, the photocurable composition allows sufficient photopolymerization and may prevent deterioration in transmittance due to unreacted initiator remaining after photopolymerization.

The encapsulating composition may be formed by mixing the photocurable monomer, the carboxylic acid group-containing photocurable monomer, and the photopolymerization initiator. Preferably, the encapsulating composition may be formed by non-solvent type mixing without using a solvent.

The encapsulating composition may have a photocuring rate of about 90% or higher. Within this range, the composition may realize a layer which does not suffer from a shift by virtue of low shrinkage stress after curing and thus may be used for encapsulation of a device. The encapsulating composition preferably has a photocuring rate of about 91% to about 97%.

The photocuring rate may be measured by any typical method. For example, the photocurable composition is applied to a glass substrate, followed by UV curing through UV irradiation at 100 mW/cm$^2$ for 10 seconds. Then, the cured film is aliquoted, followed by measuring photocuring rate using FT-IR. Photocuring rate is calculated in accordance with conditions as defined in experimental examples described below.

The encapsulating composition may have a viscosity of about 10 cps to about 50 cps as measured at 25±2° C. Within this range, the composition may be coated to form a barrier layer.

The encapsulating composition may have an adhesive strength to an inorganic barrier layer of about 20 kgf/(mm)$^2$ to about 100 kgf/(mm)$^2$ after curing. If the adhesive strength is less than about 20 kgf/(mm)$^2$, external moisture or oxygen may easily permeate between an inorganic barrier layer and an organic barrier layer, thereby causing deterioration in reliability. If the adhesive strength is higher than about 100 kgf/(mm)$^2$, uniformity of an organic barrier layer may be deteriorated. The inorganic barrier layer may include an inorganic barrier layer as described in detail below (for example, silicon oxide, silicon nitride, aluminum oxide, etc.), without being limited thereto. Preferably, the encapsulating composition barrier layer may have an adhesive strength to an inorganic barrier layer of about 20 kgf/(mm)$^2$ to about 55 kgf/(mm)$^2$.

The encapsulating composition may have a visible light transmittance of about 94% or higher after curing. Within this range, the encapsulating composition may provide improved visibility when a display is encapsulated with the composition. Here, the light transmittance is measured at a wavelength of 550 nm. Preferably, the encapsulating composition has a visible light transmittance of about 94% to about 100%. The light transmittance may be measured in accordance with experimental examples described below.

A member for an apparatus, particularly a member for a display may suffer from degradation or malfunction due to penetration of gases or liquids in a surrounding environment, for example, oxygen and/or moisture and/or water vapor, and chemicals used when processed into electronics. To prevent this, the display needs to be enclosed or encapsulated.

Examples of the member for an apparatus may include organic light emitting diodes (OLEDs), illumination devices, flexible organic light emitting device displays, metal sensor pads, microdisc lasers, electrochromic devices, photochromic devices, microelectromechanical systems, solar cells, integrated circuits, charge coupled devices, light emitting polymers, and light emitting diodes, without being limited thereto.

The encapsulating composition according to the present invention provides desirable properties in terms of adhesive strength to an inorganic barrier layer, photocuring rate, and transmittance, and thus may form an organic barrier layer which is used for enclosure or encapsulation of the apparatuses, particularly the flexible displays.

In accordance with another aspect of the invention, an organic barrier layer may include a cured product of the composition as set forth above.

The organic barrier layer may be formed by photocuring the encapsulating composition. The encapsulating composition may be coated to a thickness of about 0.1 μm to about 20 μm, followed by UV curing through UV irradiation at about 10 mW/cm$^2$ to about 500 mW/cm$^2$ for about 1 seconds to about 50 seconds, without being limited thereto.

The organic barrier layer has the aforementioned properties after curing of the encapsulating composition. Thus, the organic barrier layer may form a barrier stack together with an inorganic barrier layer as described below to be used for encapsulation of an apparatus.

In accordance with a further aspect of the present invention, a barrier stack may include the organic barrier layer and an inorganic barrier layer.

The inorganic barrier layer is formed of different materials than the organic barrier layer and thus may supplement effects of the organic barrier layer.

The inorganic barrier layer is not particularly restricted so long as the inorganic barrier layer has good light transmittance and excellent moisture and/or oxygen barrier characteristics. For example, the inorganic barrier layer may be formed of metals, intermetallic compounds or alloys, oxides of metals or mixed metals, fluorides of metals or mixed metals, nitrides of metals or mixed metals, metal carbides, oxynitrides of metals or mixed metals, borides of metals or mixed metals, oxyborides of metals or mixed metals, silicides of metals or mixed metals, or combinations thereof. The metals may include silicon (Si), aluminum (Al), selenium (Se), zinc (Zn), antimony (Sb), indium (In), germanium (Ge), tin (Sn), bismuth (Bi), transition metals, and lanthanide metals, without being limited thereto. Specifically, the inorganic barrier layer may be silicon oxide, silicon nitride, silicon oxynitride, ZnSe, ZnO, $Sb_2O_3$, $Al_2O_3$, $In_2O_3$, or $SnO_2$.

The inorganic barrier layer and the organic barrier layer may be deposited by a vacuum process, for example, sputtering, chemical vapor deposition, plasma chemical vapor deposition, evaporation, sublimation, electron cyclotron resonance-plasma enhanced chemical vapor deposition, or combinations thereof.

The organic barrier layer ensures the aforementioned properties. Thus, when the organic barrier layer and the inorganic barrier layer are alternately deposited, it is possible to secure smoothness of the inorganic barrier layer. In addition, the organic barrier layer may prevent propagation of defects of one inorganic barrier layer to other inorganic barrier layers.

The barrier stack includes the organic barrier layer and the inorganic barrier layer, and is not restricted in terms of the number thereof. The barrier stack may be formed in various combinations depending upon a desired level of resistance to penetration of oxygen and/or moisture and/or water vapor and/or chemicals.

In the barrier stack, the organic barrier layer and the inorganic barrier layer may be alternately deposited. This is because of efficacy of the organic barrier layer due to the aforementioned properties of the composition. Accordingly, the organic barrier layer may supplement or reinforce encapsulation of an apparatus by the inorganic barrier layer.

Each of the inorganic and organic barrier layers may be alternately deposited to be composed of two or more layers, wherein the number of times of deposition may be 10 or less (for example, 2 to 10), preferably 7 or less, more preferably 2 to 7.

In the barrier stack, one organic barrier layer may have a thickness of about 0.1 μm to about 20 μm, preferably about 1 μm to about 10 μm, and one inorganic may have a thickness of about 5 nm to about 500 nm, preferably about 5 nm to about 200 nm.

The barrier stack is a thin encapsulating film, and may have a thickness of about 5 μm or less, preferably about 1.5 μm to about 5 μm.

In accordance with yet another aspect of the present invention, an encapsulated apparatus may include a member for the apparatus and the barrier layers or the barrier stack. The apparatus may include the member for an apparatus as set forth above. For example, the apparatus may include displays.

The apparatus may include a member for the apparatus and barrier layers including an inorganic layer and an organic layer and formed on the member for the apparatus.

Figure 2:
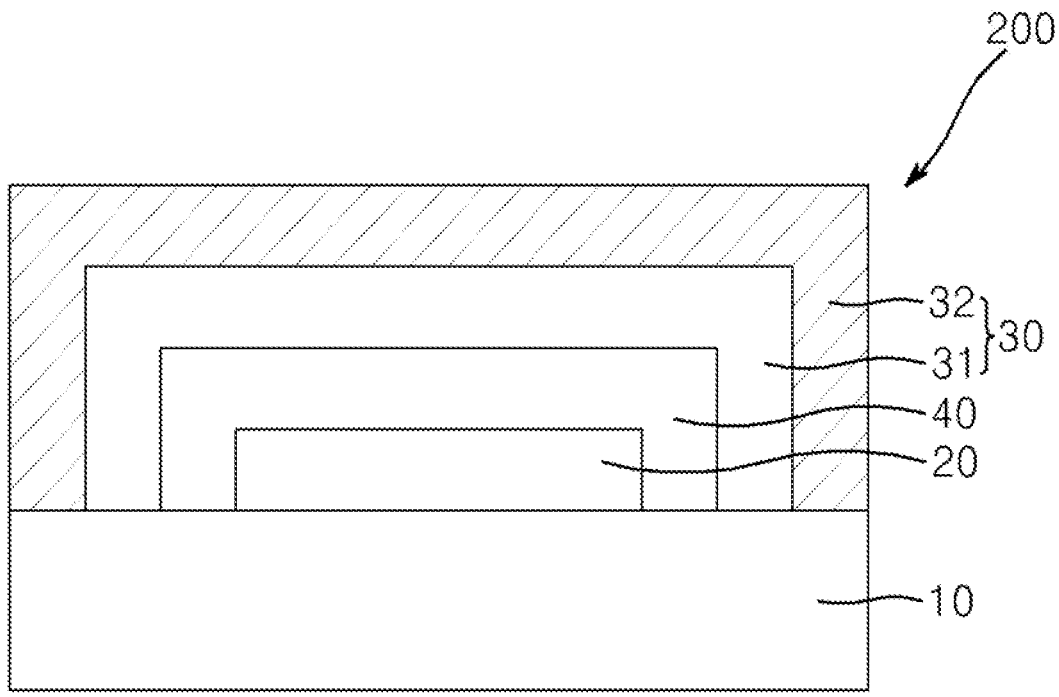
FIG. 2 is a sectional view of an encapsulated apparatus according to another embodiment of the present invention.

FIGS. 1 and 2 are sectional views of encapsulated apparatuses according to embodiments of the present invention.

Referring to FIG. 1, the encapsulated apparatus 100 includes a substrate 10, a member for the apparatus (for example, an organic light emitting device) 20 deposited on the substrate, and a barrier stack 30 including an inorganic barrier layer 31 and an organic barrier layer 32 and deposited on the member for the apparatus 20.

Referring to FIG. 2, the encapsulated apparatus 200 includes a substrate 10, a member for the apparatus (for example, an organic light emitting device) 20 deposited on the substrate 10, and a barrier stack 30 including an inorganic barrier layer 31 and an organic barrier layer 32 and deposited on the member for the apparatus 20.

FIG. 1 shows an embodiment in which the member for the apparatus 20 and the inorganic barrier layer 31 adjoin each other. FIG. 2 shows an embodiment in which an empty space 40 is formed between the member for the apparatus 20 and the inorganic barrier layer 31.

Details of the member for the apparatus, the organic barrier layer, the inorganic barrier layer, and the barrier stack are the same as described above.

The substrate is not particularly restricted so long as the member for the apparatus may be stacked on the substrate. For example, the substrate may be formed of a material, such as transparent glass, a plastic sheet, silicon, or a metal substrate.

The substrate may not be included depending upon the kind of the member for the apparatus.

The encapsulated apparatus may be prepared by any typical method. The member for the apparatus is formed on the substrate, followed by forming the inorganic barrier layer on the member for the apparatus. The encapsulating composition is coated by spin coating, slit coating, or the like, followed by UV irradiation to form the organic barrier layer. The procedure of forming the inorganic and organic barrier layers may be repeated.

Although not particularly restricted, a method of forming the inorganic and organic barrier layers may include deposition.

In one embodiment, the encapsulated apparatus is an organic electroluminescent display and includes a substrate, an organic light emitting diode formed on the substrate, an inorganic barrier layer encapsulating the organic light emitting diode, and an organic barrier layer stacked on the inorganic barrier layer, wherein the organic barrier layer has an adhesive strength to the inorganic barrier layer of about 20 $kgf/(mm)^2$ to about 100 $kgf/(mm)^2$.

In accordance with a yet further aspect of the present invention, a method of encapsulating a member for an apparatus includes: stacking one or more members for an apparatus on a substrate; and forming one or more barrier stacks including one or more inorganic barrier layers and organic barrier layers and adjoining the member for an apparatus.

Details of the substrate, the member for an apparatus, the inorganic barrier layer, the organic barrier layer, and the barrier stack are the same as described above.

The member for an apparatus is stacked on the substrate. This may be performed using the same method as in formation of inorganic and organic barrier layers, without being limited thereto.

The inorganic barrier layer and the organic barrier layer may be formed by a vacuum process, for example, sputtering, chemical vapor deposition, plasma chemical vapor deposition, evaporation, sublimation, electron cyclotron resonance-plasma enhanced chemical vapor deposition, or combinations thereof.

MODE FOR INVENTION

Hereinafter, the present invention will be described in more detail with reference to some examples. However, it should be understood that these examples are provided for illustration only and are not to be in any way construed as limiting the present invention.

Examples

Preparative Example 1

Preparation of Monomer Represented by Formula 2

In a 1000 ml flask provided with a cooling tube and a stirrer, 30 mg of hydroquinone, 50 g of DL-lactic acid (TCI Chemicals), and 86.98 g of 2-isocyanatoethyl methacrylate were stirred at 0° C. while slowly adding 100 mg of dibutyltin dilaurate thereto. The flask was heated to 50° C., followed by stirring for 4 hours. 127 g of a monomer represented by Formula 2 was obtained. The obtained compound had a HPLC purity of 97%.

[Formula 2]

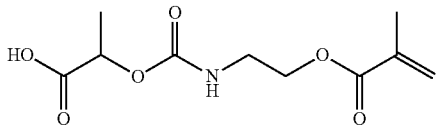

Preparative Examples 2 to 4

Preparation of Monomers Represented by Formulas 3 to 5

Monomers represented by Formulas 3 to 5 were prepared in the same manner as in Preparative Example 1 except that 4-hydroxycyclohexane carboxylic acid (Preparative Example 2), 2-hydroxy benzoic acid (Preparative Example 3), and 4-hydroxy-3-nitrobenzoic acid (Preparative Example 4) were used instead of DL-lactic acid.

[Formula 3]

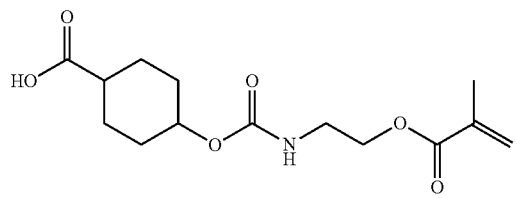

[Formula 4]

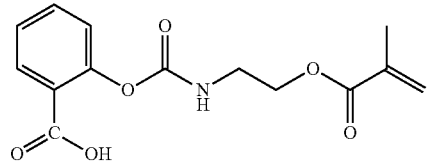

[Formula 5]

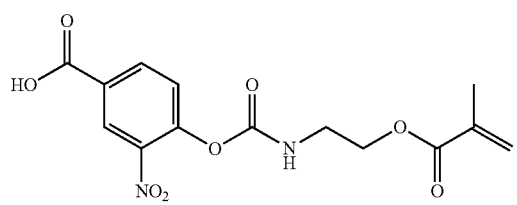

Details of components used in Examples and Comparative Examples are as follows:

(A) Photocurable monomer: (A1) Tetraethylene glycol diacrylate, (A2) Decanediol diacrylate, (A3) Pentaerythritol tetraacrylate (Aldrich Chemical)

(B) Carboxylic acid group-containing photocurable monomer: (B1) Monomer represented by Formula 2 in Preparative Example 1, (B2) Monomer represented by Formula 3 in Preparative Example 2, (B3) Monomer represented by Formula 4 in Preparative Example 3, (B4) Monomer represented by Formula 5 in Preparative Example 4

(C) Initiator: Darocur TPO (BASF Co., Ltd.) 2,4,6-trimethylbenzoyl-diphenyl-phosphineoxide Examples and Comparative Examples In a 125 ml brown polypropylene bottle, (A), (B), and (C) were placed in amounts as listed in Table 1 (unit: wt %, in terms of solid content), followed by mixing for 3 hours using a shaker, thereby preparing encapsulating compositions of Examples and Comparative Examples.

TABLE 1

| | | Example | | | | | | | | Comparative Example | | |
|---|---|---|---|---|---|---|---|---|---|---|---|---|
| | | 1 | 2 | 3 | 4 | 5 | 6 | 7 | 8 | 1 | 2 | 3 |
| A | A1 | 20 | 20 | 20 | 20 | 20 | 20 | 20 | 20 | 20 | 20 | 20 |
| A | A2 | 65 | 65 | 65 | 65 | 60 | 60 | 60 | 60 | 75 | 70 | 65 |
| A | A3 | — | — | — | — | 5 | 5 | 5 | 5 | — | 5 | 10 |
| B | B1 | 10 | — | — | — | 10 | — | — | — | — | — | — |
| B | B2 | — | 10 | — | — | — | 10 | — | — | — | — | — |
| B | B3 | — | — | 10 | — | — | — | 10 | — | — | — | — |
| B | B4 | — | — | — | 10 | — | — | — | 10 | — | — | — |
| C | | 5 | 5 | 5 | 5 | 5 | 5 | 5 | 5 | 5 | 5 | 5 |

Each of the encapsulating compositions prepared in Examples and Comparative Examples was evaluated as to the following properties. Results are shown in Table 2.

1. Die shear strength (adhesive strength) (kgf/(mm)$^2$): Adhesive strength between silicon nitrides was measured in the same manner as in measurement of die shear strength. Using a Dage series 4000PXY adhesion force measurement instrument, a force of 200 kgf was applied to an upper glass substrate from a lateral side thereof to measure detachment force. A lower glass substrate had a size of 2 cm×2 cm×1 mm (width×length×thickness), the upper glass substrate had a size of 1.5 cm×1.5 cm×1 mm (width×length×thickness), and an adhesive layer had a thickness of 500 μm Both the upper and lower glass substrates were coated with silicon nitride.

2. Light transmittance: The composition was coated onto a cleaned glass substrate to a thickness of about 10 μm±2 μm, followed by UV curing (100 m W/cm$^2$×10 seconds), thereby preparing a film (thickness: 9 μm±2 μm). Light transmittance of the prepared film in the visible range of 550 nm was measured using a spectrometer (Lambda 950, Perkin Elmer Co., Ltd.).

3. Photocuring rate (%): The photocurable composition was measured as to intensity of absorption peaks in the vicinity of 1635 cm$^{-1}$ (C=C) and 1720 cm$^{-1}$ (C=O) using an FT-IR spectrometer (NICOLET 4700, Thermo Co., Ltd.). The photocurable composition was spray-coated onto a glass substrate, followed by UV curing through UV irradiation at 100 J/cm$^2$ for 10 seconds, thereby obtaining a specimen having a size of 20 cm×20 cm×3 (width×length×thickness). Then, the cured film was aliquoted, and the intensity of absorption peaks of the cured film was measured in the vicinity of 1635 cm$^{-1}$ (C=C) and 1720 cm$^{-1}$ (C=O) using an FT-IR spectrometer (NICOLET 4700, Thermo Co., Ltd.). Photocuring rate was calculated by Equation 1:

[Equation 1]

$$\text{Photocuring rate (\%)} = |1-(A/B)| \times 100 \qquad (1)$$

where A is a ratio of the intensity of an absorption peak in the vicinity of 1635 cm$^{-1}$ to the intensity of an absorption peak in the vicinity of 1720 cm$^{-1}$ measured for the cured film, and B is a ratio of the intensity of an absorption peak in the vicinity of 1635 cm$^{-1}$ to the intensity of an absorption peak in the vicinity of 1720 cm$^{-1}$ measured for the photocurable composition.

TABLE 2

|  | Example | | | | | | | | Comparative Example | |
|---|---|---|---|---|---|---|---|---|---|---|
| S | 1 | 2 | 3 | 4 | 5 | 6 | 7 | 8 | 1 | 2 |
| Adhesive strength (kgf/mm$^2$) | 38.5 | 42.6 | 36.8 | 42.5 | 42.5 | 46.5 | 38.1 | 48.2 | 11 | 13.5 |
| sLight transmittance (%) | 96.1 | 95.4 | 95.8 | 95.6 | 96.2 | 95.7 | 94.1 | 95.8 | 96.3 | 95.3 |
| Photocuring rate (%) | 93.2 | 92.4 | 93.3 | 92.5 | 94.5 | 93.6 | 94.5 | 93.3 | 83 | 87.5 |

As can be seen from Table 2, the encapsulating composition according to the present invention exhibited excellent adhesion to an inorganic barrier layer including silicon nitride and the like and high photocuring rate, and thus could realize a barrier layer having high reliability.

Conversely, it could be seen that the encapsulating compositions of Comparative Examples 1 to 3 not including the carboxylic acid group-containing photocurable monomer exhibited poor adhesion to the inorganic barrier layer and low photocuring rate, and could not realize effects of the present invention.

Although some embodiments have been described herein, it should be understood by those skilled in the art that these embodiments are given by way of illustration only and the present invention is not limited thereto. In addition, it should be understood that various modifications, variations, and alterations can be made by those skilled in the art without departing from the spirit and scope of the present invention. Therefore, the scope of the invention should be limited only by the accompanying claims and equivalents thereof.

The invention claimed is:

1. An encapsulating composition, comprising:
   (A) a photocurable monomer; and
   (B) a carboxylic acid group-containing photocurable monomer,
   wherein the carboxylic acid group-containing photocurable monomer (B) is represented by Formula 1:

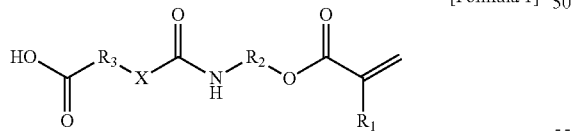

[Formula 1]

wherein, in Formula 1,
$R_1$ is hydrogen or a substituted or unsubstituted $C_1$ to $C_{20}$ alkyl group,
$R_2$ is a substituted or unsubstituted $C_1$ to $C_{30}$ alkylene group, a substituted or unsubstituted $C_6$ to $C_{30}$ alkylene group, or a $C_5$ to $C_{20}$ cycloalkylene group,
$R_3$ is a substituted or unsubstituted $C_1$ to $C_{30}$ alkylene group, a substituted or unsubstituted $C_6$ to $C_{30}$ arylene group, a substituted or unsubstituted $C_6$ to $C_{30}$ heteroarylene group, or a $C_5$ to $C_{20}$ cycloalkylene group, and X is —O—, —S—, or —NR—, in which R is hydrogen a $C_1$ to $C_{10}$ alkyl group.

2. The encapsulating composition according to claim 1, wherein the carboxylic acid group-containing photocurable monomer (B) includes a monomer containing a carboxylic acid group having a cyclized single or double bond.

3. The encapsulating composition according to claim 1, wherein the carboxylic acid group-containing photocurable monomer (B) is represented by one of the following Formulae 2 to 6:

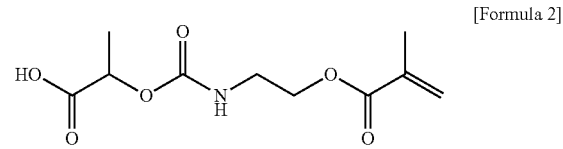 [SMILES: C=C(C)C(=O)OCCNC(=O)OC(C)C(=O)O]

[Formula 2]

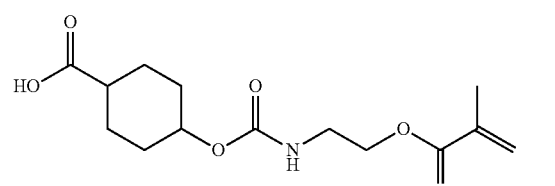

[Formula 3]

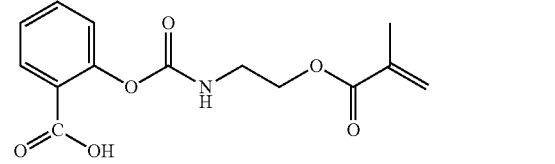

[Formula 4]

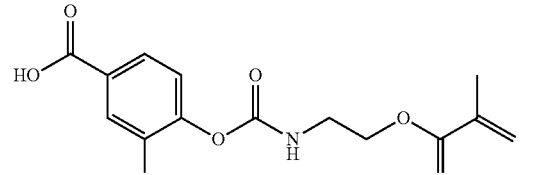

[Formula 5]

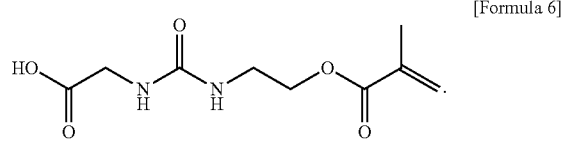

[Formula 6]

4. The encapsulating composition according to claim 1, wherein the photocurable monomer (A) includes a monomer containing 1 to 30 substituted or unsubstituted vinyl groups, 1 to 30 substituted or unsubstituted acrylate groups, or 1 to 30 substituted or unsubstituted methacrylate groups.

5. The encapsulating composition according to claim 1, wherein the photocurable monomer (A) includes at least one of a (meth)acrylate having a $C_1$ to $C_{20}$ alkyl group, a di(meth)acrylate of a $C_2$ to $C_{20}$ diol, a tri(meth)acrylate of a $C_3$ to $C_{20}$ triol, a tetra(meth)acrylate of a $C_4$ to $C_{20}$ tetraol, and a di(meth)acrylate containing at least one unit of —(—Y—O—)$_n$— and —Y—, in which Y is a linear or branched $C_1$ to $C_5$ alkylene group, and n is an integer from 1 to 5.

6. The encapsulating composition according to claim 1, wherein the encapsulating composition includes, in terms of solid content, about 70 wt % to about 95 wt % of the photocurable monomer (A); and about 5 wt % to about 30 wt % of the carboxylic acid group-containing photocurable monomer (B).

7. The encapsulating composition according to claim 1, further comprising: (C) a photopolymerization initiator.

8. The encapsulating composition according to claim 7, wherein the encapsulating composition includes, in terms of solid content, about 20 wt % to about 95 wt % of the photocurable monomer (A); about 1 wt % to about 60 wt % of the carboxylic acid group-containing photocurable monomer (B); and about 0.1 wt % to about 20 wt % of the photopolymerization initiator (C).

9. A barrier layer comprising a cured product of the encapsulating composition according to claim 1.

10. An encapsulated apparatus, comprising:
a member for the apparatus; and
a barrier stack formed on the member for the apparatus and including an inorganic barrier layer and an organic barrier layer,
wherein the organic barrier layer has an adhesive strength to the inorganic barrier layer of about 20 kgf/(mm)$^2$ to about 100 kgf/(mm)$^2$,
wherein the organic barrier layer includes a cured product of the encapsulating composition according to claim 1.

11. The encapsulated apparatus according to claim 10, wherein:
the inorganic barrier layer includes, metal oxides, metal nitrides, metal carbides, metal oxynitrides, metal oxyborides, or mixtures thereof, and
the metal includes at least one of silicon (Si), aluminum (Al), selenium (Se), zinc (Zn), antimony (Sb), indium (In), germanium (Ge), tin (Sn), bismuth (Bi), transition metals, and lanthanide metals.

12. The encapsulated apparatus according to claim 10, wherein:
one organic barrier layer has a thickness of about 0.1 μm to about 20 μm, and
one inorganic barrier layer has a thickness of about 5 nm to about 500 nm.

13. The encapsulated apparatus according to claim 10, wherein the member for the apparatus includes an organic light emitting device, a flexible organic light emitting device, an illumination device, a metal sensor pad, a microdisc laser, an electrochromic device, a photochromic device, a microelectromechanical system, a solar cell, an integrated circuit, a charge coupled device, a light emitting polymer, or a light emitting diode.

* * * * *